(12) United States Patent
Kim et al.

(10) Patent No.: US 10,535,510 B2
(45) Date of Patent: Jan. 14, 2020

(54) SUBSTRATE-TREATING APPARATUS AND METHOD FOR TREATING A SUBSTRATE USING THE SAME

(71) Applicant: Samsung Display Co., Ltd., Yongin, Gyeonggi-Do (KR)

(72) Inventors: Bong-Kyun Kim, Hwaseong-si (KR); Young-Min Moon, Seongnam-si (KR); Soo-Min An, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 687 days.

(21) Appl. No.: 14/809,028

(22) Filed: Jul. 24, 2015

(65) Prior Publication Data

US 2016/0096201 A1 Apr. 7, 2016

(30) Foreign Application Priority Data

Oct. 6, 2014 (KR) .................. 10-2014-0134570

(51) Int. Cl.
*H01L 21/02* (2006.01)
(52) U.S. Cl.
CPC .............................. *H01L 21/02068* (2013.01)
(58) Field of Classification Search
CPC ..... B08B 3/022; B08B 3/08; H01L 21/02068; H01L 21/67028; H01L 21/6776; H01L 21/02071; C11D 11/0047; C11D 7/06; C11D 3/02071; G03F 7/42
See application file for complete search history.

(56) References Cited

U.S. PATENT DOCUMENTS

| 5,308,400 | A  | * | 5/1994 | Chen ................. H01L 21/02052 134/2 |
| 6,021,790 | A  | * | 2/2000 | Yoshitani ................. B08B 1/02 134/62 |
| 6,927,176 | B2 | * | 8/2005 | Verhaverbeke ........... B08B 3/08 134/1.2 |
| 7,931,755 | B2 | * | 4/2011 | Nishio .................... B08B 5/023 134/36 |
| 2002/0134403 | A1 | * | 9/2002 | Selwyn ..................... B08B 3/02 134/1.2 |
| 2003/0098040 | A1 | * | 5/2003 | Nam ........................ B08B 3/12 134/1.3 |

(Continued)

FOREIGN PATENT DOCUMENTS

| KR | 10-2006-0061622 A | 6/2006 |
| KR | 10-2007-0008151 A | 1/2007 |
| KR | 10-2010-0123471 A | 11/2010 |

*Primary Examiner* — Nadine G Norton
*Assistant Examiner* — Christopher Remavege
(74) *Attorney, Agent, or Firm* — Innovation Counsel LLP

(57) ABSTRACT

A substrate-treating apparatus includes a liquid-providing part, a first liquid-removing knife and a returning part. The liquid-providing part provides a first liquid chemical for cleaning a substrate that includes a metal pattern and a photoresist pattern on the metal pattern, and for removing an etchant that remains on the substrate. The first liquid-removing knife sprays a second liquid chemical in a direction inclined and opposite to a returning direction of the substrate, so as to remove the first liquid chemical, the first liquid chemical including a metal precipitate. The returning part returns the substrate from the liquid-providing part toward the first liquid-removing knife in the returning direction.

15 Claims, 4 Drawing Sheets

(56) References Cited

U.S. PATENT DOCUMENTS

| | | | |
|---|---|---|---|
| 2004/0104199 A1* | 6/2004 | Uesugi | C23F 1/02 216/83 |
| 2004/0241996 A1* | 12/2004 | Hung | H01L 21/31138 438/689 |
| 2005/0037628 A1* | 2/2005 | Ohsawa | H01L 21/31111 438/778 |
| 2005/0115671 A1* | 6/2005 | Araki | B08B 7/04 156/345.12 |
| 2007/0246085 A1* | 10/2007 | Wakatsuki | B08B 3/022 134/95.3 |
| 2008/0092925 A1* | 4/2008 | Hong | G03F 7/423 134/21 |
| 2008/0096046 A1* | 4/2008 | Yamashita | C23C 8/02 428/655 |
| 2008/0244925 A1* | 10/2008 | Shin | F26B 21/004 34/611 |
| 2012/0006485 A1* | 1/2012 | Tanabe | B08B 3/022 156/345.11 |
| 2012/0064660 A1* | 3/2012 | Yang | H01L 21/67028 438/98 |
| 2012/0118331 A1* | 5/2012 | Jeong | B08B 3/022 134/26 |
| 2012/0318306 A1* | 12/2012 | Jeong | B08B 3/02 134/61 |
| 2013/0125930 A1* | 5/2013 | Huang | B05C 5/0208 134/61 |
| 2017/0154795 A1* | 6/2017 | Li | B08B 3/022 |

\* cited by examiner

SUBSTRATE-TREATING APPARATUS AND METHOD FOR TREATING A SUBSTRATE USING THE SAME

PRIORITY STATEMENT

This application claims priority under 35 U.S.C. § 119 to Korean Patent Application No. 10-2014-0134570 filed on Oct. 6, 2014, and all the benefits accruing therefrom, the content of which is herein incorporated by reference in its entirety.

BACKGROUND

1. Field

Exemplary embodiments relate generally to flat panel display fabrication. More particularly, exemplary embodiments relate to a substrate-treating apparatus which can remove a metal precipitate, thereby preventing disconnection of a wiring, and a method for treating a substrate using the apparatus.

2. Description of the Related Art

A flat panel display, which may be enlarged, thinned and weight-lightened, is currently and commonly used as a display device. An example of such a flat panel display may include a liquid crystal display, a plasma display panel, an organic light emitting display and the like.

A liquid crystal display device is one type of flat panel display which is widely used. The liquid crystal display device applies a voltage to liquid crystal molecules to change orientation of the liquid crystal molecules. According to the change of orientation of the liquid crystal molecules, change of optical properties (such as a birefringence, an optical activity, a dichroism or a light-scattering) of liquid crystal cells is converted into visual change in order to display an image.

The liquid crystal display device includes a liquid crystal display panel for displaying an image. The liquid crystal display panel includes wiring patterns formed from a metal. The wiring patterns may be formed through a photolithography method, including a light-exposing process using a mask and an etching process using an etchant. After the etching process, a cleaning process using a cleaning solution is performed to remove a remaining etchant on a substrate.

Thereafter, a gas may be sprayed with a high pressure from a liquid-removing knife to remove a remaining cleaning solution. The liquid-removing knife may be an air knife, and may spray air, or another gaseous medium, with a high pressure to remove the remaining cleaning solution. The remaining cleaning solution includes a metal. The metal may react with other components of the cleaning solution, thereby generating a metal precipitate. The metal precipitate may accumulate at an end of the liquid-removing knife by high pressure air.

When the metal precipitate is dropped on the substrate, a photoresist for forming the metal wirings may be damaged, thereby causing disconnection of the metal wirings.

SUMMARY

Exemplary embodiments provide a substrate-treating apparatus that is capable of removing a metal precipitate in a cleaning process, to prevent disconnection of a metal wiring.

Exemplary embodiments also provide a method for treating a substrate using this substrate-treating apparatus.

According to an exemplary embodiment, a substrate-treating apparatus includes a liquid-providing part, a first liquid-removing knife and a returning part. The liquid-providing part provides a first liquid chemical for cleaning a substrate that includes a metal pattern and a photoresist pattern on the metal pattern, and for removing an etchant that remains on the substrate. The first liquid-removing knife sprays a second liquid chemical in a direction inclined and opposite to a returning direction of the substrate, so as to remove the first liquid chemical, the first liquid chemical including a metal precipitate. The returning part returns the substrate from the liquid-providing part toward the first liquid-removing knife in the returning direction.

In an exemplary embodiment, the metal precipitate includes copper.

In an exemplary embodiment, the first liquid chemical and the second liquid chemical include a substantially same material, and the first liquid chemical and the second liquid chemical include ammonium hydroxide, hydrogen peroxide and water.

In an exemplary embodiment, the metal precipitate is formed by reaction of the first liquid chemical with copper from the etchant. The metal precipitate includes at least one of sodium persulfate and copper chloride.

In an exemplary embodiment, the first liquid-removing knife sprays the second liquid chemical at a pressure of about 3 Kgf/cm$^2$ to about 10 Kgf/cm$^2$.

In an exemplary embodiment, the first liquid-removing knife receives the second liquid chemical from the liquid-providing part.

In an exemplary embodiment, the substrate-treating apparatus further includes a second liquid-removing knife configured to spray a gas in a direction inclined and opposite to the returning direction of the substrate, so as to remove the first liquid chemical.

In an exemplary embodiment, the gas includes an air or a nitrogen gas.

In an exemplary embodiment, the second liquid-removing knife sprays the gas at a pressure of about 3 Kgf/cm$^2$ to about 10 Kgf/cm$^2$.

In an exemplary embodiment, the substrate-treating apparatus further includes a third liquid-removing knife adjacent to the second liquid-removing knife and configured to spray a third liquid chemical in a direction inclined and opposite to the returning direction of the substrate, so as to remove the first liquid chemical. The second liquid-removing knife is disposed between the first liquid-removing knife and the third liquid-removing knife.

In an exemplary embodiment, the substrate-treating apparatus further includes a third liquid-removing knife adjacent to the first liquid-removing knife and configured to spray a gas in a direction inclined and opposite to the returning direction of the substrate, so as to remove the first liquid chemical. The first liquid-removing knife is disposed between the second liquid-removing knife and the third liquid-removing knife.

According to an exemplary embodiment, a method for treating a substrate is provided. According to the method, a metal pattern is formed on a substrate, and a photoresist pattern is formed on the metal pattern. A first liquid chemical is provided to remove an etchant remaining on the substrate. A second liquid chemical is sprayed on the substrate to remove an amount of the first liquid chemical that remains on the substrate and includes a metal precipitate.

In an exemplary embodiment, the first liquid chemical and the second liquid chemical include a substantially same material, and the first liquid chemical and the second liquid chemical include ammonium hydroxide, hydrogen peroxide and water.

In an exemplary embodiment, the second liquid chemical is sprayed at a pressure of about 3 Kgf/cm$^2$ to about 10 Kgf/cm$^2$.

In an exemplary embodiment, a gas is further sprayed onto the substrate to remove the first liquid chemical.

In an exemplary embodiment, the gas includes an air or a nitrogen gas.

In an exemplary embodiment, the gas is sprayed at a pressure of about 3 Kgf/cm$^2$ to about 10 Kgf/cm$^2$.

In an exemplary embodiment, the second liquid chemical and the gas are sprayed substantially simultaneously.

In an exemplary embodiment, the gas is sprayed after the second liquid chemical is sprayed.

In an exemplary embodiment, the second liquid chemical is sprayed after the gas is sprayed.

According to the exemplary embodiments, a metal precipitate in an etchant used for an etching process of a metal pattern may be removed. Thus, disconnection of a wiring may be prevented.

BRIEF DESCRIPTION OF THE DRAWINGS

The above and other features and advantages will become more apparent by describing exemplary embodiments thereof with reference to the accompanying drawings, in which.

DETAILED DESCRIPTION

Exemplary embodiments will be described more fully hereinafter with reference to the accompanying drawings, in which various embodiments are shown. The various figures are not to scale.

Figure 1:
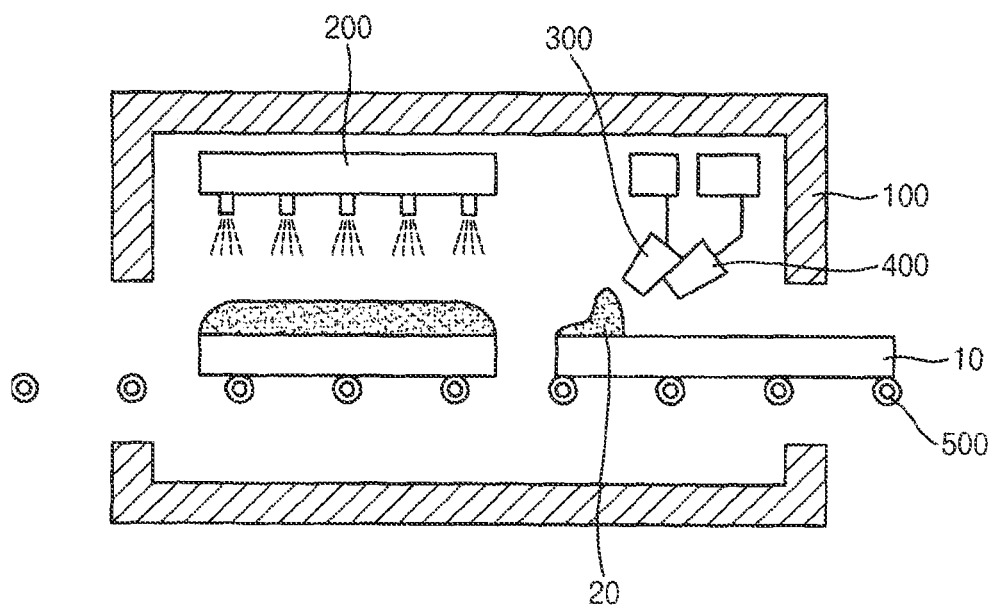
FIG. 1 is a cross-sectional view illustrating a substrate-treating apparatus according to an exemplary embodiment.
Figure 2:
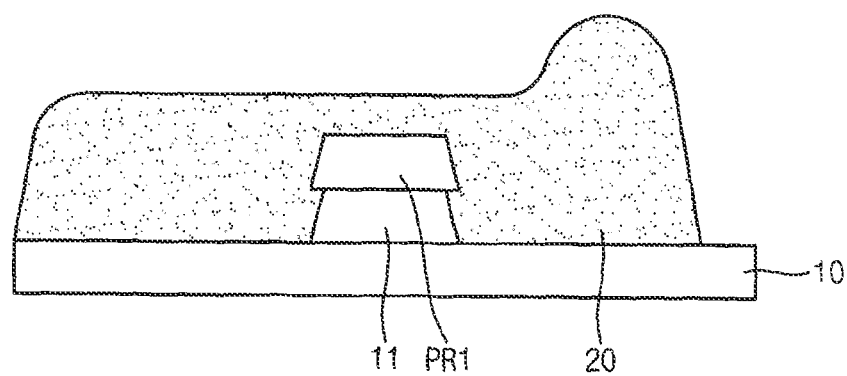
FIGS. 2 and 3 are cross-sectional views illustrating a substrate treated according to an exemplary embodiment.
Figure 3:
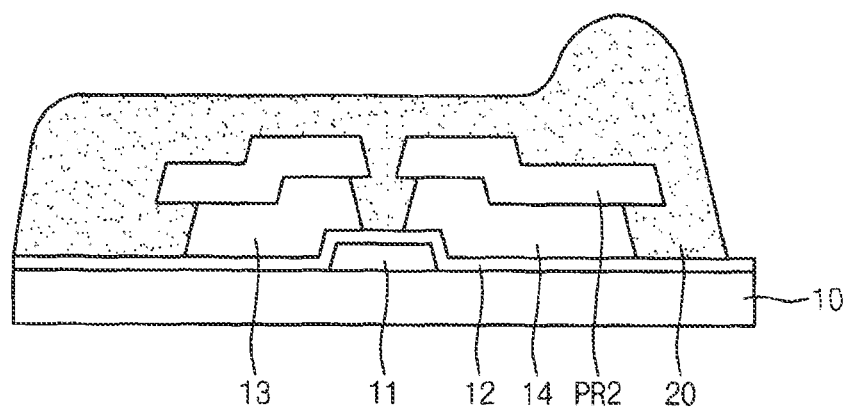
Figure 4:
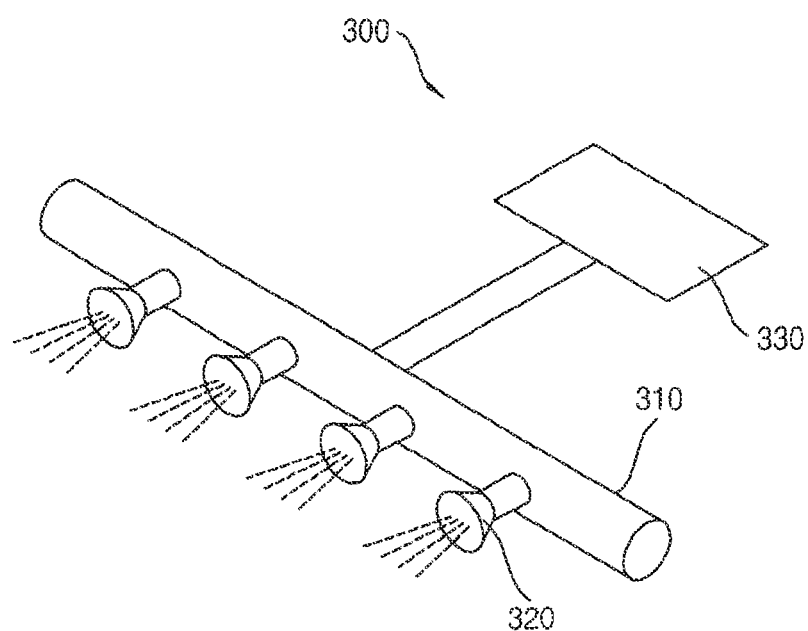
FIG. 4 is a perspective view illustrating a first liquid-removing knife of a substrate-treating apparatus according to an exemplary embodiment.
Figure 5:
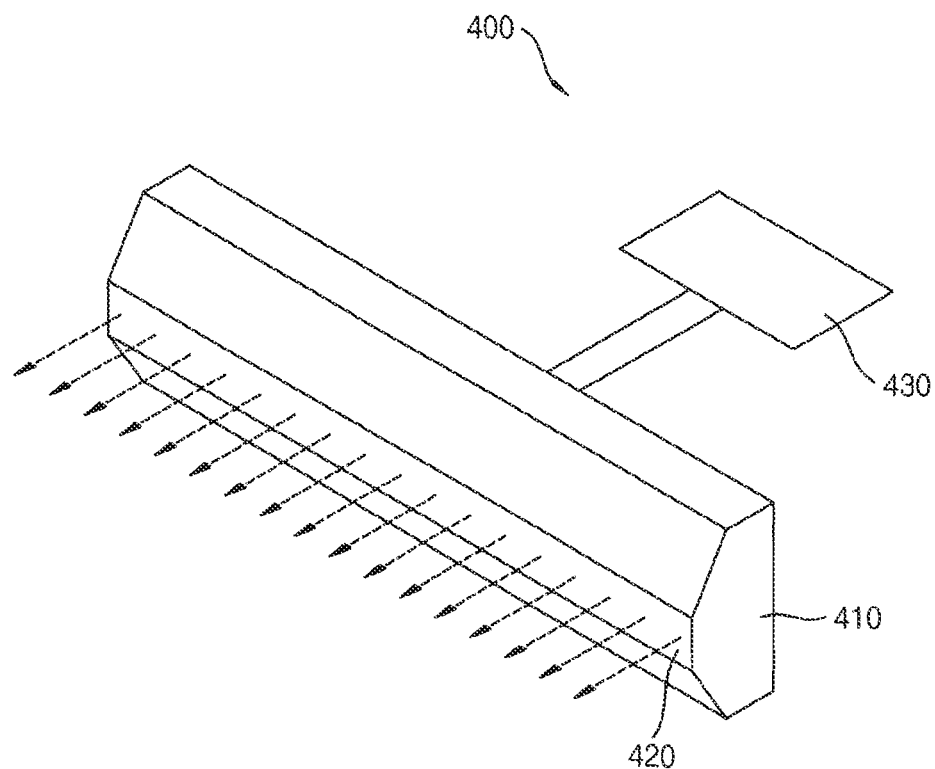
FIG. 5 is a perspective view illustrating a second liquid-removing knife of a substrate-treating apparatus according to an exemplary embodiment.

FIG. 1 is a cross-sectional view illustrating a substrate-treating apparatus according to an exemplary embodiment. FIGS. 2 and 3 are cross-sectional views illustrating a substrate treated according to an exemplary embodiment. FIG. 4 is a perspective view illustrating a first liquid-removing knife of a substrate-treating apparatus according to an exemplary embodiment. FIG. 5 is a perspective view illustrating a second liquid-removing knife of a substrate-treating apparatus according to an exemplary embodiment.

Referring to FIGS. 1 to 5, a substrate-treating apparatus includes a cleaning chamber 100, a liquid-providing part 200, a first liquid-removing knife 300, a second liquid-removing knife 400 and a returning part 500.

The cleaning chamber 100 provides a space for cleaning a substrate 10, which may be provided after an etching process. The liquid-providing part 200, the first liquid-removing knife 300, the second liquid-removing knife 400 and the returning part 500 may be disposed in or partially in the cleaning chamber 100.

A metal layer is formed on the substrate 10 for forming a metal pattern. A photoresist composition is coated on the metal layer, and patterned by using a mask to form a photoresist pattern. The photoresist pattern is used as a mask in a process of etching the metal layer using an etchant to form the metal pattern. Thus, the metal pattern is formed on the substrate 10. This process is known, and as such the various layers and patterns are not shown in FIG. 1.

For example, the metal pattern may include copper.

For example, the metal pattern may be a gate pattern including a gate electrode 11 and a gate line. A first photoresist pattern PR1 may be disposed on the gate electrode 11.

In another embodiment, the metal pattern may be a data pattern including a source electrode 13 and a drain electrode 14. A second photoresist pattern PR2 may be disposed on the source electrode 13 and the drain electrode 14.

After the etching process, the substrate 10 may be cleaned. In the process of cleaning the substrate 10, a first liquid chemical may be provided by the liquid-providing part 200.

For example, the first liquid chemical may include at least one of ammonium hydroxide (NH$_4$OH), hydrogen peroxide (H$_2$O$_2$) and water (H$_2$O). Particularly, the first liquid chemical may include a mixture of ammonium hydroxide, hydrogen peroxide and water.

An etching composition may remain on the substrate 10 after the metal pattern is etched. The remaining etching composition may include a metal. For example, the metal may be dispersed within the etching composition, and may include copper.

The metal may react with the first liquid chemical to form a metal precipitate that is a metal salt. For example, the metal precipitate may include sodium persulfate, copper chloride or the like. The metal precipitate may be combined with aminotetrazole, ammonium (NH$_4$) or the like.

The first liquid-removing knife 300 sprays a second liquid chemical to remove the first liquid chemical (including the metal precipitate) remaining on the substrate 100.

In one example, the first liquid-removing knife 300 includes a source-providing tube 310, a source-spraying part 320 and a source-providing part 330 that provides a liquid-removing source through the source-providing tube 310.

The first liquid-removing knife 300 may be inclined to spray the second liquid chemical in a direction inclined and opposite to a returning direction (i.e. a direction of movement) of the substrate 10.

The first liquid chemical and the second liquid chemical may include a same material. For example, the second liquid chemical may include ammonium hydroxide (NH$_4$OH), hydrogen peroxide (H$_2$O$_2$) and water (H$_2$O).

As an example of operation, the first liquid-removing knife 300 may spray the second liquid chemical at a pressure of about 3 Kgf/cm$^2$ to about 10 Kgf/cm$^2$. When the pressure is less than 3 Kgf/cm$^2$, excessive amounts of the first liquid chemical may remain on the substrate 10. When the pressure is more than 10 Kgf/cm$^2$, the substrate 100, the metal pattern or the photoresist pattern on the substrate 100 may be damaged.

The first liquid-removing knife 300 may be connected to the liquid-providing part 200 to receive the second liquid chemical.

The substrate-treating apparatus includes the second liquid-removing knife 400, which is disposed adjacent to the first liquid-removing knife 300.

The second liquid-removing knife 400 may spray a gas for removing the first liquid chemical and any remaining metal precipitate from the substrate 10.

The second liquid-removing knife 400 may include a gas-providing tube 410, a gas-spraying part 420 and a gas-providing part 430 providing a liquid-removing source through the gas-providing tube 410.

The second liquid-removing knife 400 may be inclined to spray the gas in a direction inclined and opposite to a returning direction of the substrate 10 (i.e. oriented at an angle with respect to the upper surface of substrate 10, and with the gas sprayed in a direction opposite to a direction of movement of the substrate 10).

As an example, the gas may include air or a nitrogen gas.

In one operating example, the second liquid-removing knife 400 may spray the gas at a pressure of about 3 Kgf/cm$^2$ to about 10 Kgf/cm$^2$. When the pressure is less than 3 Kgf/cm$^2$, excessive amounts of the first liquid chemical may remain on the substrate 10. When the pressure is more than 10 Kgf/cm$^2$, the substrate 100, the metal pattern or the photoresist pattern on the substrate 100 may be damaged.

The first liquid-removing knife 300 and the second liquid-removing knife 400 may be positioned adjacent to each other. Furthermore, the second liquid chemical and the gas may be sprayed simultaneously from the first liquid-removing knife 300 and the second liquid-removing knife 400 to remove the first liquid chemical that remains on the substrate 10.

In another embodiment, the first liquid-removing knife 300 and the second liquid-removing knife 400 may be spaced apart from each other by a distance. Any suitable distance is contemplated.

In operation of such an embodiment, the first liquid-removing knife 300 may operate prior to operation of the second liquid-removing knife 400.

For example, after the first liquid-removing knife 300 sprays the second liquid chemical, the second liquid-removing knife 400 may spray the gas to remove any of the first and second liquid chemicals that remain on the substrate 10.

Figure 6:
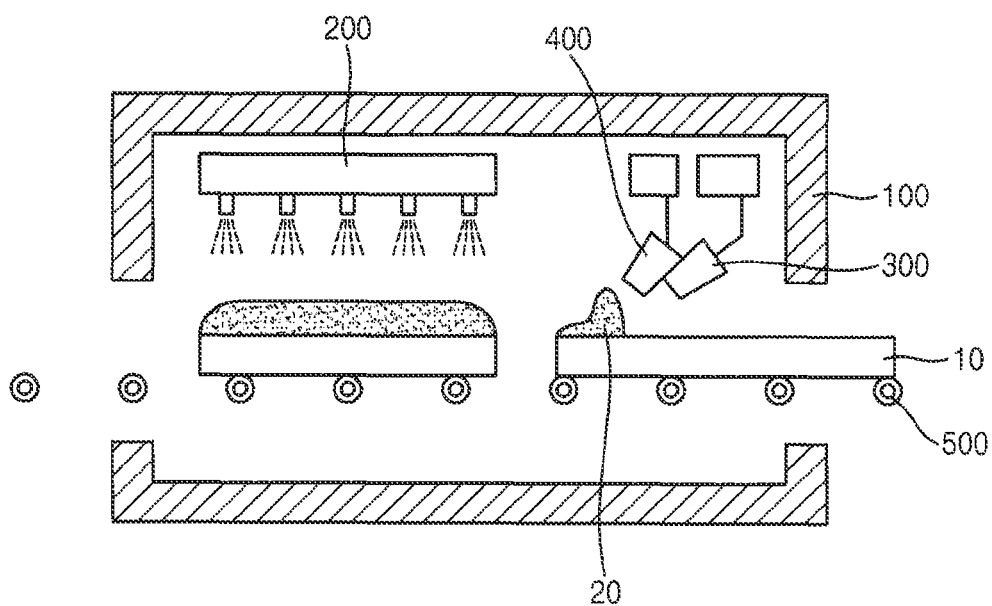
FIG. 6 is a cross-sectional view illustrating a substrate-treating apparatus according to an exemplary embodiment.

The returning part 500 may return the substrate 100 from the liquid-providing part 200 toward the first liquid-removing knife 300 and the second liquid-removing knife 400 (i.e., rightward in the view of FIG. 6). The returning part 500 may be disposed inside and outside the cleaning chamber 100 to consecutively move the substrate 10. To accomplish this, the returning part 500 may include a roller.

FIG. 6 is a cross-sectional view illustrating a substrate-treating apparatus according to an exemplary embodiment.

Referring to FIG. 6, a first liquid-removing knife 300 may be spaced apart from a second liquid-removing knife 400. In exemplary operation, the second liquid-removing knife 400 may spray a gas prior to the first liquid-removing knife 300 spraying a second liquid chemical. For example, after the second liquid-removing knife 400 sprays the gas, the first liquid-removing knife 300 may spray the second liquid chemical to remove the first liquid chemical that remains on the substrate 10. When the first liquid-removing knife 300 and the second liquid-removing knife 400 are used in a same process, a pressure of the gas from the second liquid-removing knife 400 may be reduced. Thus, even if the second liquid-removing knife 400 sprays the gas prior to the first liquid-removing knife 300, a metal precipitate that may be generated at the end of the second liquid-removing knife 400 may be reduced.

Figure 7:
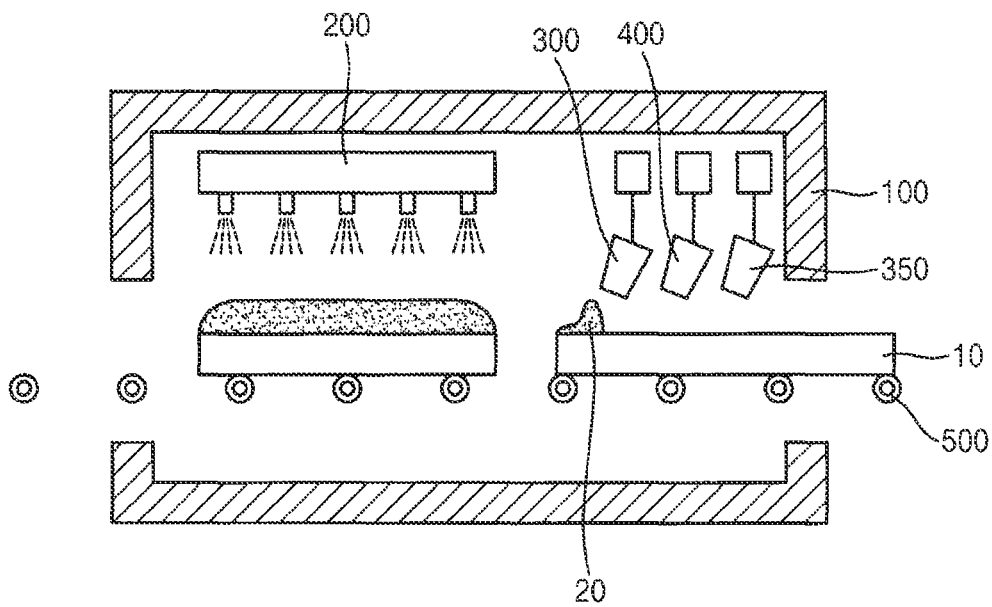
FIG. 7 is a cross-sectional view illustrating a substrate-treating apparatus according to an exemplary embodiment.

FIG. 7 is a cross-sectional view illustrating a substrate-treating apparatus according to a further exemplary embodiment.

Referring to FIG. 7, a substrate-treating apparatus includes a cleaning chamber 100, a liquid-providing part 200, a first liquid-removing knife 300, a second liquid-removing knife 400, a third liquid-removing knife 350 and a returning part 500.

The substrate-treating apparatus may be substantially the same as the substrate-treating apparatus illustrated in FIG. 1, except for further including the third liquid-removing knife 350. Thus, any duplicated explanation may be omitted.

The third liquid-removing knife 350 is disposed adjacent to the second liquid-removing knife 400. For example, the second liquid-removing knife 400 may be disposed between the first liquid-removing knife 300 and the third liquid-removing knife 350.

The third liquid-removing knife 350 may spray a third liquid chemical to remove a first liquid chemical including a metal precipitate and remaining on a substrate 10. The third liquid chemical may include a same material as a second liquid chemical sprayed by the first liquid-removing knife 300.

In use, the first liquid-removing knife 300 may spray the second liquid chemical prior to operation of the second liquid-removing knife 400, and the second liquid-removing knife 400 may spray a gas prior to operation of the third liquid-removing knife 350. More specifically, after the first liquid-removing knife 300 sprays the second liquid chemical, the second liquid-removing knife 400 may spray the gas, and then the third liquid-removing knife 350 may spray the third liquid chemical to remove the first liquid chemical that remains on the substrate 10.

The third liquid-removing knife 350 may be inclined to spray the third liquid chemical in a direction inclined and opposite to a returning direction of the substrate 10.

In operation, the third liquid-removing knife 350 may spray the third liquid chemical with a pressure of about 3 Kgf/cm$^2$ to about 10 Kgf/cm$^2$.

The third liquid-removing knife 350 may be connected to the liquid-providing part 200 to receive the third liquid chemical.

Figure 8:
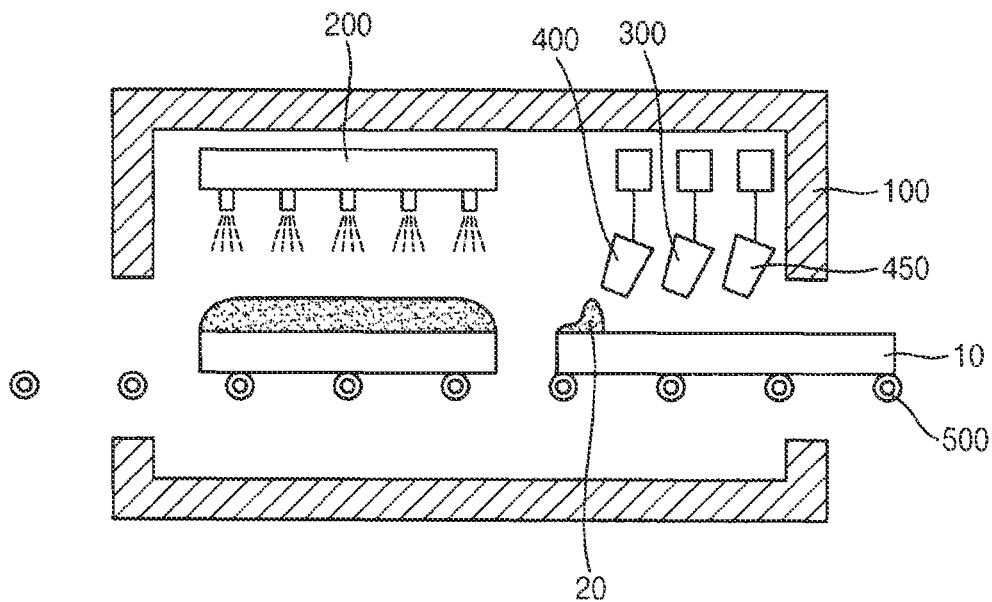
FIG. 8 is a cross-sectional view illustrating a substrate-treating apparatus according to an exemplary embodiment.

FIG. 8 is a cross-sectional view illustrating a substrate-treating apparatus according to a still further exemplary embodiment. Referring to FIG. 8, a substrate-treating apparatus includes a cleaning chamber 100, a liquid-providing part 200, a first liquid-removing knife 300, a second liquid-removing knife 400, a third liquid-removing knife 450 and a returning part 500.

The substrate-treating apparatus may be substantially the same as the substrate-treating apparatus illustrated in FIG. 6, except for further including the third liquid-removing knife 450. Thus, any duplicated explanation may be omitted.

The third liquid-removing knife 450 is disposed adjacent to the first liquid-removing knife 300. For example, the first liquid-removing knife 300 may be disposed between the second liquid-removing knife 400 and the third liquid-removing knife 450.

The third liquid-removing knife 450 may spray a gas to remove material from first liquid chemical including a metal precipitate and remaining on a substrate 10.

For example, the second liquid-removing knife 400 may spray a gas prior to the first liquid-removing knife 300, and the first liquid-removing knife 300 may spray a second liquid chemical prior to operation of the third liquid-removing knife 450. More specifically, after the second liquid-removing knife 400 sprays the gas, the first liquid-removing knife 300 may spray the second liquid chemical, and then the third liquid-removing knife 450 may spray the gas to remove the first liquid chemical that remains on the substrate 10. When the first liquid-removing knife 300, the second liquid-removing knife 400 and the third liquid-removing knife 450 are used in a same process, a pressure of the gas from the second liquid-removing knife 400 may be reduced. Thus, even if the second liquid-removing knife 400 sprays the gas prior to the first liquid-removing knife 300, a metal precipitate that may be generated at the end of the second liquid-removing knife 400 may be reduced.

The third liquid-removing knife 450 may be inclined to spray the gas in a direction inclined and opposite to a returning direction of the substrate 10.

As an operational example, the third liquid-removing knife 450 may spray the gas with a pressure of about 3 Kgf/cm$^2$ to about 10 Kgf/cm$^2$.

As will be observed by one of ordinary skill in the art, the substrate-treating apparatuses and methods for treating a substrate according to exemplary embodiments may be used for manufacturing a display apparatus such as a liquid crystal display apparatus, an organic light-emitting display apparatus, or the like.

The foregoing is illustrative and is not to be construed as limiting thereof. Although a few exemplary embodiments have been described, those skilled in the art will readily appreciate that many modifications are possible in the exemplary embodiments without materially departing from the novel teachings, aspects, and advantages of the invention. Accordingly, all such modifications are intended to be included within the scope of this disclosure. Any and all features of the various embodiments, disclosed or otherwise, may be mixed and matched in any manner, so as to create further embodiments also encompassed by the invention.

What is claimed is:

1. A substrate-treating apparatus comprising:
   a liquid-providing part configured to provide a first liquid chemical for cleaning a substrate that includes a metal pattern and a photoresist pattern on the metal pattern, and for removing an etchant that remains on the substrate;
   a first liquid-removing knife configured to spray a second liquid chemical in a first direction inclined and opposite to a returning direction of the substrate, and to remove the first liquid chemical, the first liquid chemical including a metal precipitate;
   a returning part configured to return the substrate from the liquid-providing part toward the first liquid-removing knife in the returning direction;
   a second liquid-removing knife configured to emit a gas and spray the gas in the first direction, and to remove the first liquid chemical; and
   a third liquid-removing knife adjacent to the second liquid-removing knife and configured to spray a third liquid chemical in the first direction, and to remove the first liquid chemical,
   wherein the gas includes an air or a nitrogen gas,
   wherein the second liquid-removing knife is disposed between the first liquid-removing knife and the third liquid-removing knife,
   wherein the first liquid-removing knife is inclined in the first direction and the liquid-providing part is not inclined in the first direction.

2. The substrate-treating apparatus of claim 1, wherein the metal precipitate includes copper.

3. The substrate-treating apparatus of claim 1, wherein the first liquid chemical and the second liquid chemical include a substantially same material, and wherein the first liquid chemical and the second liquid chemical include ammonium hydroxide, hydrogen peroxide and water.

4. The substrate-treating apparatus of claim 3, wherein the metal precipitate is formed by reaction of the first liquid chemical with copper from the etchant, and
   the metal precipitate includes at least one of sodium persulfate and copper chloride.

5. The substrate-treating apparatus of claim 1, wherein the first liquid-removing knife is configured to spray the second liquid chemical at a pressure of about 3 Kgf/cm2 to about 10 Kgf/cm2.

6. The substrate-treating apparatus of claim 1, wherein the first liquid-removing knife is configured to receive the second liquid chemical from the liquid-providing part.

7. The substrate-treating apparatus of claim 1, wherein the second liquid-removing knife is configured to spray the gas at a pressure of about 3 Kgf/cm2 to about 10 Kgf/cm2.

8. The substrate-treating apparatus of claim 1, further comprising a fourth liquid-removing knife adjacent to the first liquid-removing knife and configured to spray a gas in a direction inclined and opposite to the returning direction of the substrate, so as to remove the first liquid chemical,
   wherein the first liquid-removing knife is disposed between the second liquid-removing knife and the fourth liquid-removing knife.

9. A method of treating a substrate, the method comprising:
   forming a metal layer on a substrate, and forming a photoresist pattern on the metal layer;
   etching the metal layer using an etchant;
   providing a first liquid chemical to remove an etchant remaining on the substrate;
   spraying, by a first liquid-removing knife and in a first direction inclined and opposite to a returning direction of the substrate, a second liquid chemical on the substrate to remove an amount of the first liquid chemical that remains on the substrate and includes a metal precipitate;
   emitting, by a second liquid-removing knife, a gas and spraying the gas onto the substrate to remove the first liquid chemical; and
   spraying, by a third liquid-removing knife, a third liquid chemical on the substrate to remove the first liquid chemical,
   wherein the gas includes an air or a nitrogen gas,
   wherein the second liquid-removing knife is disposed between the first liquid-removing knife and the third liquid-removing knife
   wherein the first liquid-removing knife is inclined in the first direction.

10. The method of claim 9, wherein the first liquid chemical and the second liquid chemical include a substantially same material, and the first liquid chemical and the second liquid chemical include ammonium hydroxide, hydrogen peroxide and water.

11. The method of claim 9, wherein the second liquid chemical is sprayed at a pressure of about 3 Kgf/cm2 to about 10 Kgf/cm2.

12. The method of claim 9, wherein the gas is sprayed at a pressure of about 3 Kgf/cm2 to about 10 Kgf/cm2.

13. The method of claim 9, wherein the second liquid chemical and the gas are sprayed substantially simultaneously.

14. The method of claim 9, wherein the gas is sprayed after the second liquid chemical is sprayed.

15. The method of claim 9, wherein the second liquid chemical is sprayed after the gas is sprayed.

\* \* \* \* \*